United States Patent [19]

Clemens et al.

[11] 4,240,195

[45] Dec. 23, 1980

[54] DYNAMIC RANDOM ACCESS MEMORY

[75] Inventors: James T. Clemens, Allentown; John D. Cuthbert, Bethlehem; Frank J. Procyk, Center Valley; George M. Trout, Macungie, all of Pa.

[73] Assignee: Bell Telephone Laboratories, Incorporated, Murray Hill, N.J.

[21] Appl. No.: 942,861

[22] Filed: Sep. 15, 1978

[51] Int. Cl.³ .......................................... B01J 17/00
[52] U.S. Cl. .................................. 29/571; 29/577 R; 29/578; 29/589; 29/590; 357/23; 357/51; 357/59
[58] Field of Search ................ 29/571, 578, 589, 590, 29/577; 357/23, 59

[56] References Cited

U.S. PATENT DOCUMENTS

| 4,012,757 | 3/1977 | Koo | 357/23 |
| 4,031,608 | 6/1977 | Togei | 29/571 |

Primary Examiner—W. C. Tupman
Attorney, Agent, or Firm—Arthur J. Torsiglieri

[57] ABSTRACT

A memory in which each cell comprises an MOS transistor merged with a storage capacitor and in which the cells are arranged to permit adjacent pairs of transistors in a common column to share a common source and the transistors in a common row to share a common gate electrode conductor. The memory uses a first polycrystalline silicon layer which is patterned to provide interconnected storage electrodes and a second polycrystalline silicon layer which is patterned to provide a plurality of stripes to serve as the bit sense lines and a plurality of gate electrodes.

3 Claims, 7 Drawing Figures

DYNAMIC RANDOM ACCESS MEMORY

TECHNICAL FIELD

This invention relates to semiconductive memory apparatus and more particularly to such apparatus of the dynamic random access type.

BACKGROUND OF THE INVENTION

The invention is an improvement in dynamic random access memories basically of the kind described in U.S. Pat. No. 4,012,757 which issued to J. T. Koo on Mar. 15, 1977, and includes a method for making such an improved memory.

The Koo memory is a random access memory which uses an array of storage cells each of which includes a single transistor control element merged with a single capacitive storage element. The array of storage cells is organized as a two-dimensional matrix of rows and columns. Elements of each row are coupled by way of the controls or gates of the transistors which comprise the row. This coupling conductor is generally termed the word line. Elements of each column are coupled by way of the source regions of the transistors which comprise the column. This coupling conductor is generally termed the bit line. In this memory the bulk of the semiconductive chip typically is p-type and a diffused n-type region which extends the length of the array serves as a merged bit line and the source regions of all the transistors in a particular column. Sensing is also accomplished by way of the bit lines, and, accordingly, this line is sometimes also called the sense line.

Each transistor includes its localized-type channel region, which is overlaid with its suitably insulated gate or control, and a virtual drain region which is overlaid with a suitably insulated electrode. In operation this electrode is held at a suitable bias potential which maintains localized inversion of the underlying region so that it effectively behaves as an n-type region and as a virtual drain zone. Similarly, control signals applied by way of the word line to the gate of a selected transistor cause localized inversion of the associated channel region to provide conduction between the source and drain regions of the selected transistor.

Moreover, each of the drain regions serves as one plate of the capacitive storage element and the other plate is provided by the overlying electrode. Accordingly, in each cell the drain region of the transistor is merged with one plate of the capacitive storage element. The total storage capacitance essentially comprises two components, the larger is the capacitance associated with the inverted layer and the overlying storage electrode, the smaller is the capacitance associated with the inverted layer and the underlying portion of the chip.

The mergers of the bit line and source regions and of the drain regions and capacitive elements are intended to increase the compactness of the cell to permit increased density of the cells on a single chip and a larger number of cells in a single chip. For reasons well known it is advantageous to maximize the number of cells in a chip consistent with economic manufacture of the chip.

Further to conserve space and thereby make possible increased cell density, the cells are physically arranged in pairs in an interleaved pattern to permit adjacent transistors of a pair in a common column to share a common source zone and the transistors in a common row to share a common conductive layer for the gate electrode. Electrical isolation of adjacent pair of cells from all other pairs is achieved by surrounding each pair by a passive region of more heavily doped p-type material which resists inversion in operation.

It is to be understood that the terms "row" and "column," as used herein, could be interchanged since they are purely arbitrary. Similarly, it is to be understood that whether a region acts as a source or drain depends on the conductivity type of the silicon chip and the polarity of the applied potentials.

An object of the present invention is to provide an improved memory, particularly by increasing its packing density.

Another object is a convenient process for making such a memory.

SUMMARY OF THE INVENTION

We have found that the merging of the source regions and the sense line as a continuous diffused region in the silicon chip does not achieve the optimal ratio of active storage cell capacitance to total storage cell area. In particular we have found that for a constant set of lithographic design rules elimination of the extended diffused merged source and bit line and substitution therefor of individual source regions interconnected by a polysilicon line overlying the chip permits improvement in this ratio. Moreover, the elimination of the diffused bit line from the chip eliminates the capacitance associated with the p-n junction otherwise formed between the diffused bit line and the higher conductivity passive regions. This capacitance reduces the signal on the bit line available for sensing by the appropriate sense amplifier circuitry.

Accordingly, the elimination of the diffused bit line in the chip and its replacement by a polysilicon bit line over the chip permits either larger signals on the bit line for the same total cell area which can be used to relax other requirements or smaller area cells for the same sensing signal.

Conductive bit lines extending over the wafer had been proposed for some early cell designs. However, in recent cell designs which employ a virtual drain electrode, the diffused bit line approach has become the norm since it largely eliminates the need for any localized ohmic source connections to the silicon chip. Such a design promised increased simplicity of fabrication, no small consideration in the manufacture of high density cell memories, such as 16 K memories.

However, as indicated above, we have found that the use of polycrystalline silicon bit lines can provide some unexpected advantages and moreover we have devised a novel process which permits this modification with little increase in fabrication complexity.

Accordingly, in another aspect, the invention relates to a novel process for making a dynamic RAM memory involving this novel interconnection arrangement.

Accordingly, in one aspect the invention is a memory cell which is of the kind employing a control transistor and a storage capacitor in which the virtual drain of the transistor is merged with one plate of the capacitor and which is characterized by separate source zones which are interconnected by polycrystalline silicon bit lines which make direct connection to the source zones.

In another aspect, the invention is a process for making such a memory cell which is characterized by the step of forming the bit lines and the gate electrodes of the transistors from a common layer and forming the source zones by a self-aligned implantation step and the localized diffusion of implanted ions out of the bit line into the silicon chip.

DETAILED DESCRIPTION

Figure 1:
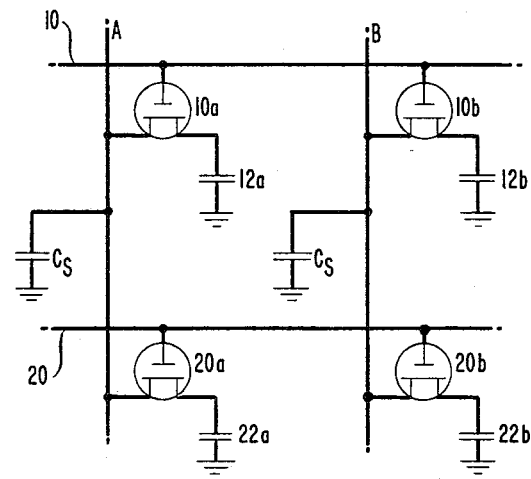
FIG. 1 is a circuit schematic of a portion of the memory of the kind to which the invention is applicable.

With reference now to the drawing, FIG. 1 illustrates schematically a portion of a 16 K memory now available commercially. For purposes of simplification only four cells are shown in a two-dimensional matrix, of which 10a and 10b form the transistors of one row, 20a and 20b the transistors of another, and 10a and 20a form one column and 10b and 20b another. The sources of 10a and 20a are coupled to a common bit or sense line A, and the sources of 10b and 20b to bit or sense line B. The gates of 10a and 10b are each coupled to the word select line 10, and the gates of 20a and 20b to the word select line 20. Serially connected between the drains of transistors 10a, 10b, 20a, and 20b and a point of reference potential, shown as ground, are the storage capacitors 12a, 12b, 22a and 22b, respectively. A parasitic capacitance $C_S$ is shown associated with each sense line.

In most commercial memories presently, the transistors are of the N-channel type or NMOS, although it is feasible to employ instead PMOS transistors. At the present state of the art, in commercial memories the semiconductor is silicon.

The operation of a memory of the kind described is well known. In particular, a read command on a word select line 10 will cause transistors 10a and 10b to become conductive and any signals stored in capacitors 12a and 12b will be read into the sense lines A and B which are otherwise at a potential fixed prior to sensing. Appropriate peripheral circuitry will couple a change in state of line A or line B, depending on which is selected to be read to a data output terminal, and at the end of the read cycle reinsert the information into the cell read.

The signal strength read into sense line A from cell (10a, 12a) will largely be determined by the ratio of the capacitance of capacitor 12a with respect to the parasitic capacitance $C_S$. Accordingly, $C_S$ is made desirably small consistent with processing economy. For increasing signal strength it is also desirable that the capacitance of capacitor 12 be as large as possible consistent with the overall cell size to be used for the desired cell density.

Advantageously, the cells are grouped in pairs with adjacent transistors of a pair in a common column essentially sharing a common source and adjacent transistors of a pair in a common row essentially sharing a common gate conductor such that the ratio of the useful capacitance of the cell to the stray capacitance of its bit line may be maintained at a high value even though the area of each cell is small.

Figure 2:
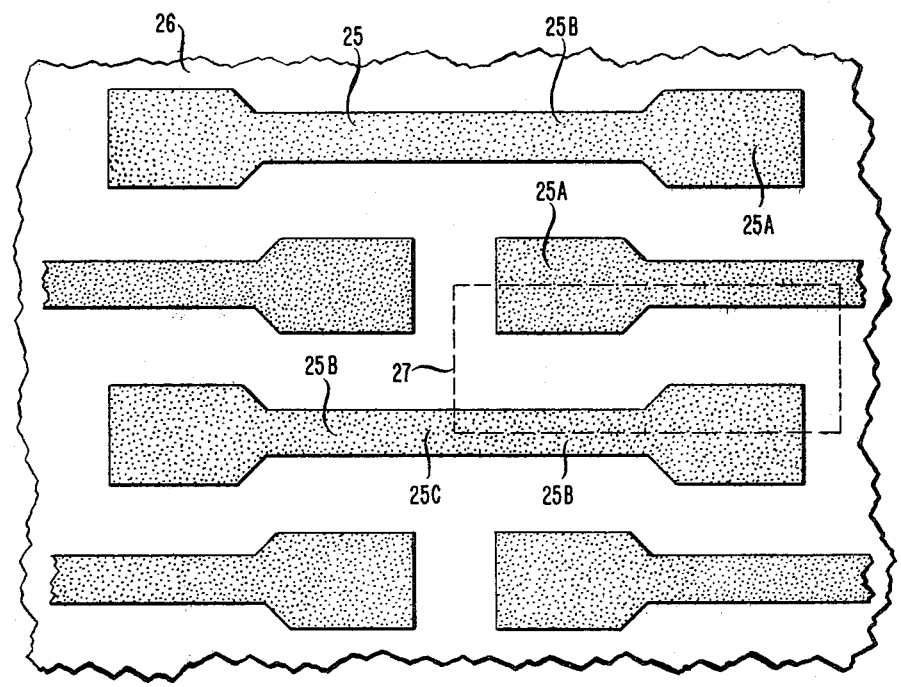
FIG. 2 is a schematic plan view showing how the cells are laid out in a memory in accordance with a preferred embodiment of the invention.

FIG. 2 is a plan view which illustrates the staggered layout of the memory cells in the chip.

It is to be understood that as used herein the term "silicon chip" includes a thick monocrystalline silicon wafer which is self-supporting, an epitaxial silicon layer grown on a suitable supporting conductive base which may be silicon, and an epitaxial silicon layer grown on a suitable insulating base such as sapphire.

It is presently contemplated that in the preferred embodiment of the invention, the silicon chip will comprise a relatively lightly doped p-type epitaxial silicon layer on a relatively highly doped silicon substrate which provides most of the mechanical support, in the manner described in application Ser. No. 848,000, filed on Nov. 3, 1977.

In FIG. 2 each of the regions 23 corresponds to an active surface portion of the chip, each such portion includes a pair of memory cells, corresponding to an adjacent pair of transistors in the same column. The enlarged end regions 25A are essentially the separate storage regions of the pair, the adjacent narrow regions 25B are the two channel or control regions of the two control transistors of the pair, and the intermediate region 25C, the common source of the two transistors of the pair. The active surface portions 25 are separated from one another by the passive portion 26 which is essentially continuous and forms the bulk of the chip. The broken line 27 shows the average area per unit cell in the chip.

In the N-channel memory being described specifically, before the application of operating voltages storage and gate regions 25A and 25B will be relatively lightly doped p-type, the source regions 25C will be relatively heavily doped n-type, and the passive portion 26 will be relatively heavily doped p-type. In this structure, the voltage necessary to invert the conductivity type of portion 26 will be significantly higher than that needed for the regions 25A and 25B, and so such portion will normally remain uninverted during operation to provide electrical isolation between the various active portions. Moreover, to insure that the inactive portions are not inverted because of the voltages on any overlying conductors, they normally will be overlaid selectively with a thick "field" oxide. Various techniques are known for minimizing inadvertent inversion including the use of ion implantation and localized oxidation to provide a chip in which the passive surface portions are more heavily doped and overlaid with a thick field oxide, and whose overall surface is still sufficiently planar for convenient metallization.

Figure 3:
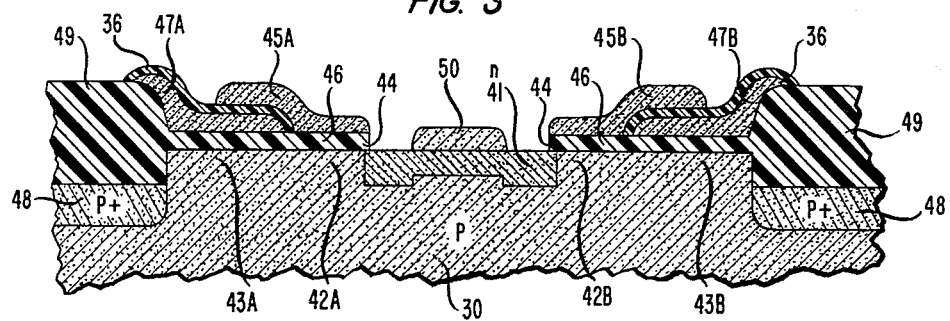
FIG. 3 is a cross section showing an adjacent pair of cells in a common column in a memory in accordance with a preferred embodiment of the invention.

FIG. 3 is a cross section showing the basic structure of an individual cell pair corresponding to a pair of adjacent cells in a common column. It includes the silicon chip 30 whose bulk is p-type and which includes the n-type zone 41 which serves as the common source zone of the two transistors forming the pair. Symmetrically disposed on opposite sides of the source zone are the channel regions 42A and 42B of the two transistors of the pair and the storage regions 43A and 43B, which also serve as the virtual drain zones of the two transistors. Overlying the channel regions 42A and 42B and insulated therefrom by the gate oxide layer 44 are gate electrodes 45A and 45B, respectively. Overlying the storage regions 43A and 43B and insulated therefrom by the capacitor oxide layer 46 are storage electrodes 47A and 47B, respectively. Enclosing the active portion made up of zone 41, and regions 42A, 42B, 43A, and 43B are the passive portions 48 which are more heavily p-type than regions 42A, 42B, 43A and 43B and over which extends the thick field oxide 49. The field oxide is shown to have penetrated into the silicon chip as results from the usual localized oxidation process used.

In operation, each of the storage electrodes 47A, 47B is biased at a sufficient positive potential with respect to the bulk of the chip to maintain each of storage regions 43A, 43B in an inverted state so it effectively acts as a n-type region and so can serve as the drain zone of its transistor. It is important that the gate electrodes 45A and 45B and storage electrodes 47A and 47B be so closely spaced relative to one another that when an appropriate turn-on voltage is applied to the gate of either transistor, a barrier free path is provided for charge flow between the source and drain zones of such transistor.

A low resistance source electrode 50 is provided to the common source zone 41 and this forms part of the bit line which extends, suitably insulated where direct connection is to be avoided, normal to the plane of the paper along the full length of the array.

Advantageously, the bit line, the gate electrodes and the storage electrodes are each of high conductivity polycrystalline silicon and the insulating layers 44, 46 and 49 are essentially of silicon oxide. Of these, layers 44 and 46 are relatively thin while layer 49 is considerably thicker. Additionally, the insulating layer 50 between the gate electrodes and the storage electrodes where they overlap also is advantageously of silicon oxide.

With reference again to FIG. 2 there is shown in plan view a portion of the chip roughly corresponding to the area of several cell pairs of the kind shown in FIG. 3 at an early processing stage. In particular, it represents the chip at the stage after there has been defined the localized active portions 25 surrounded by the passive portion 26. The active portions are lightly doped p-type and the passive portion is heavily doped p-type. Typically, the active portions are coated with a thin oxide layer about 500 Angstroms thick and the passive portion is coated with a thick oxide layer, about 1.0 to 1.5 microns thick. Techniques are well known for achieving such a structure.

Figure 4:
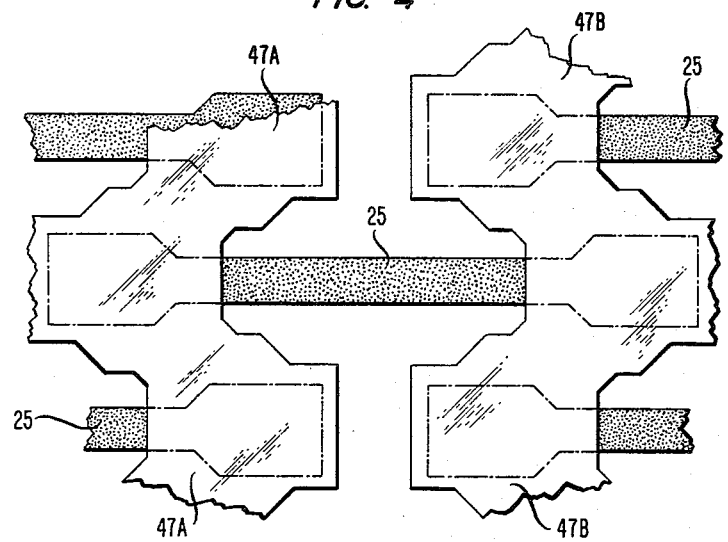
FIGS. 4 through 7 illustrate in a schematic plan view at different stages of fabrication a portion of the memory shown in FIG. 2.

There is then deposited over the chip a polycrystalline silicon layer which is patterned by photolithographic techniques to provide the storage electrodes 47A, 47B as shown in FIG. 4. Typically this layer as deposited is about 6000 Angstroms thick and is treated to be made highly conductive in any suitable fashion. These are symmetrically disposed about the central region of the active regions (where ultimately is to be formed the source zone) and each includes a portion overlying completely the desired storage region of the active portion but leaves uncovered the remainder of the active zone. Additionally, the conductive layer extends vertically to serve as the storage electrode of each of the cells in the same column and so is shown with extensions to permit an uninterrupted run. The staggered run shown is to accommodate the pattern of cells seen in FIG. 2. Since each of the storage electrodes of the array is normally to be maintained at the same fixed potential, all these storage electrodes will ultimately be interconnected.

In the formation of these storage electrodes, an insulating layer is provided thereover to permit the overlay of other conductors. If, as is advantageous, these storage electrodes are made of polycrystalline silicon, the desired insulating layer may be formed in situ by thermal conversion of the exposed surface, typically to have a thickness of about 3000 Angstroms. The oxide advantageously is formed before patterning of the polycrystalline layer to form the storage electrodes. Alternatively a suitable dielectric such as silicon oxide or silicon nitride may be deposited by any known techniques.

Often the thickness of the insulating layer underlying the storage electrode will be different from that underlying the gate electrode. In the preferred embodiment being discussed, for example, there was desired a storage oxide layer thickness of 500 Angstroms and a gate oxide layer thickness of about 675 Angstroms.

Accordingly, to this end after formation of the storage electrodes, the insulating layer remaining over the region to serve as the gate is reformed to the desired thickness. Normally this involves removal of the original layer and formation of another. After formation of the desired thickness gate oxide layer, there is deposited the gate electrode. In accordance with the process aspect of this invention, the gate electrodes and the bit lines are formed from a common deposited layer, advantageously of polycrystalline silicon and typically deposited to have an initial thickness of about 6000 Angstroms.

Figure 5:
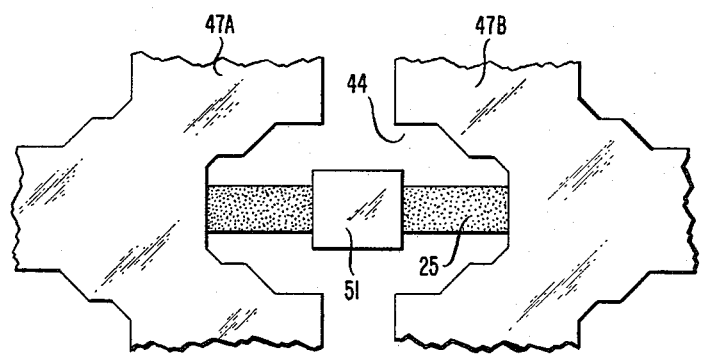

Preliminary to making the bit line connection to the silicon chip at what will be the source zone of the transistors of a cell pair, it is necessary to open a contact window in the overlying insulating layer, which will have been formed during the gate oxidation step. In FIG. 5 there is shown the opening 51 formed in the insulating layer 44 in the central region of the cell pair. This should be chosen to expose much of what will serve as the common source zone.

Figure 6:
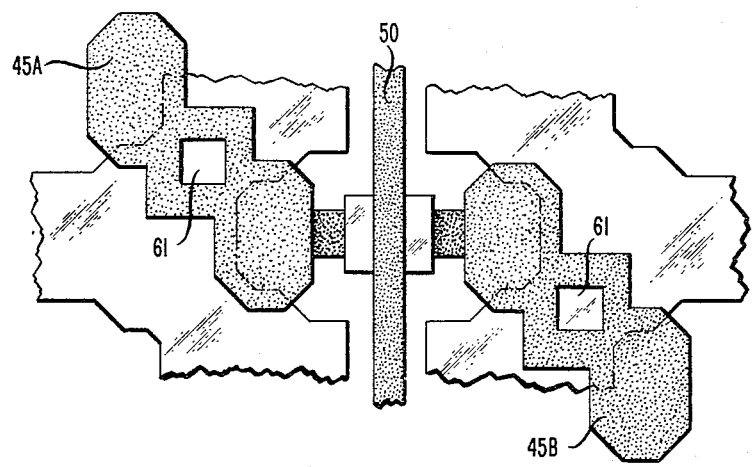

There is then deposited over the chip the second polycrystalline silicon layer which is patterned by photolithographic techniques to include two distinct parts, as seen in FIG. 6.

First, the pattern includes a plurality of bit lines 50, each of which interconnects all the cells in a given column through the contact openings previously formed. Actually the number of connections which are formed in a single column need only be one-half the number of transistors in the column since each is used to connect to an adjacent pair of transistors of a column.

Second, the pattern includes a plurality of gate electrodes 45A, 45B, each of which serves as the gate electrode of an adjacent pair of transistors in a common row. To this end, as shown, each gate electrode advantageously includes two separate octagonal end sections, each of which overlies the gate region of a different one of two adjacent transistors in a row, together with an intermediate square section which interconnects the two end sections and to which ultimately the word line is to be connected for interconnecting the gate electrodes of all the transistors in a given row of cells.

By forming the bit lines and the gate electrodes from a common layer, advantageously of polycrystalline silicon, the polysilicon bit lines can be realized with a minimum of added fabrication complexity over the prior art structure using a diffused bit line.

To improve the electrical properties of the connection between the silicon chip and the bit line, the conditions for deposition are chosen so that in the region of contact the deposited silicon grows nearly epitaxially on the substrate monocrystalline silicon. To this end, the layer is formed by flowing silane past the silicon chip which is kept at an elevated temperature of about 700 degrees C. in an atmosphere of either nitrogen or hydrogen.

There remain to be formed the source zones which are made to be self-aligned with the gate electrodes in familiar fashion.

Advantageously the n-type source zone can be formed by ion implantation with arsenic. Typically the chip can be irradiated uniformly and penetration into the chip will be controlled by the overlying layers. In particular, the gate electrode and its gate oxide will serve to provide self-alignment of the n-region with the channel. Additionally, the bit line will be implanted and the arsenic atoms later moved from the line into the region where it is in direct contact with the silicon chip by a later diffusion heating step. Moreover the exposed region between the gate electrodes and the bit lines will be penetrated directly by the arsenic so that eventually there is formed an n-type region extending the full distance between the two gate electrodes as shown in FIG. 2. Also as seen there, the n-type region will be slightly shallower under the bit line because of its masking effect. Typically an ion beam of $1 \times 10^{16}$ arsenic atoms at 30 KV energy can be used for the implantation followed by a later heating for annealing and diffusing. A typical heating might include a first heating in a nitrogen atmosphere for about an hour at 900 degrees C. followed by a later heating in an oxidizing atmosphere for about forty minutes at 1000 degrees C. The ion implantation also serves to increase the conductivity of the material forming the bit lines and gate electrodes.

There is then formed an insulating layer over essentially the entire surface of the chip. Advantageously, this layer is a phosphosilicate glass, typically about 17000 Angstroms thick, deposited by chemical vapor deposition, of the kind known to be useful for gettering undesired contaminants, particularly sodium.

Next there are formed openings in the last-formed insulating layer to permit electrical connections to the gate electrodes by the word lines, each of which is used to interconnect all the gate electrodes in a common row. In FIG. 6 there are shown openings 61 in the gate electrodes.

Figure 7:
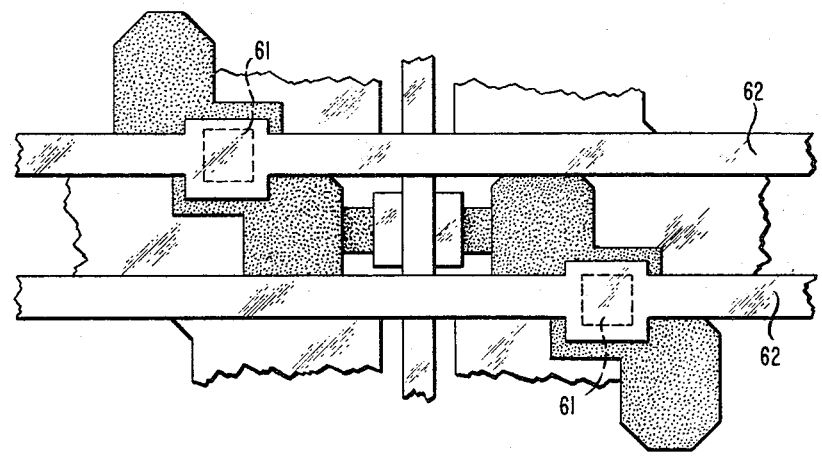

Next, as shown in FIG. 7, there are deposited the word lines 62 which run the width of the memory array to an edge where they can be conveniently accessed. The word lines advantageously are of an aluminum-silicon alloy, known to be useful to minimize spiking effects. These lines contact the gate electrodes by way of windows 61.

Finally, it is found advantageous to provide a coating of plasma-deposited silicon nitride (not shown) over the completed chip as a further barrier to the penetration of undesirable impurities.

In the fabrication of the various patterns, photolithographic techniques familiar to workers in the art would currently be employed, although it is expected that eventually more advanced techniques, or direct electronbeam processing, such as X-ray lithography may prove preferable. Similarly, it is contemplated that where close control of the etching used for pattern definition is involved, such as patterning of the polysilicon layers and the formation of contact windows, dry etching techniques, such as radio frequency plasma etching, will be employed in preference to wet etching. Similarly, it is contemplated that, where close control of the formation of p-n junctions in the chip is important, ion implantation techniques will be employed. Additionally, in time it may become feasible to substitute other semiconductive material, such as gallium arsenide, for silicon in the chip.

In one design intended for use in a 64 K memory, the relevant dimensions were as follows: the gate oxide was about 675 Angstroms thick; the insulating layer under the storage electrode was 500 Angstroms thick; the polycrystalline silicon layer forming the storage electrodes was 5000 Angstroms thick; the polycrystalline silicon layer forming the bit lines and the gate electrodes was also 5000 Angstroms thick; the aluminum word line was 8000 Angstroms thick; the silicon oxide spacer layers are all about 3000 Angstroms thick; the total length of an active portion comprising a pair of cells was about 43 microns; the width at its narrow portion about 3 microns and at its wide portion about 6 microns wide; each of the two wide portions of a cell was about 8 microns long; the bit line was about 2 microns wide; the double source was about 10 microns long; and each gate zone was about 5 microns long.

The peripheral circuitry employed with the memory cells may be any of the kind known to workers in the art to be suitable.

We claim:

1. A process for making a random access memory in which a plurality of memory cells are arranged in rows and columns and each memory cell includes a transistor and a capacitor with one plate of the capacitor being merged with a virtual drain zone of the transistor, which includes the steps of preparing a silicon chip which includes active portions where memory cells are to be formed and passive portions which serve to isolate the active portions CHARACTERIZED IN THAT the process includes the steps of depositing over the silicon chip and insulated therefrom a first polycrystalline silicon layer which is patterned to provide a storage electrode over at least that region of each active portion which serves as the merged plate of the capacitor of a cell, depositing over the chip a second polycrystalline silicon layer which is electrically insulated from the patterned electrodes of the first layer and which is thereafter suitably patterned to form both a plurality of gate electrodes, one over at least the region of each active portion which is to serve as the channel of the transistor of a cell, and a plurality of conductive lines each of which has a portion which directly contacts the silicon chip at a part of the active portion which is to serve as the source of the transistor, wherein each conductive line connects all of the transistors common to a separate column of the array, converting the conductivity type of each active portion which is to serve as a source of a transistor, both in the region between the gate electrode and the directly contacting portion of the conductive line and in a region underlying the directly contacting portion, and forming over the chip and insulated therefrom a second plurality of lines, each line of said second plurality electrically contacting the gate electrodes of all the transistors common to a separate row of the array.

2. A process in accordance with claim 4 in which the formation of the second polycrystalline silicon layer is done such that in the region where the layer contacts the chip the layer tends to grow epitaxially.

3. A process in accordance with claim 1 in which the converting step includes irradiating the silicon chip with conductivity-type determining ions and heating for a time and at a temperature that the implanted ions diffuse into the silicon chip in sufficient numbers for converting the conductivity type selectively of the regions which are to serve as the source zones of the transistors.

* * * * *

UNITED STATES PATENT AND TRADEMARK OFFICE
CERTIFICATE OF CORRECTION

PATENT NO. : 4,240,195

DATED : December 23, 1980

INVENTOR(S) : James T. Clemens, John D. Cuthbert, Frank J. Procyk, George M. Trout It is certified that error appears in the above—identified patent and that said Letters Patent is hereby corrected as shown below:

Column 8, line 56, delete "4" and insert --1--.

Signed and Sealed this

Tenth Day of March 1981

[SEAL]

Attest:

RENE D. TEGTMEYER

Attesting Officer     Acting Commissioner of Patents and Trademarks